US012610591B2

(12) United States Patent
Jang et al.

(10) Patent No.: US 12,610,591 B2
(45) Date of Patent: Apr. 21, 2026

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Kyongtaek Lee, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 512 days.

(21) Appl. No.: 17/895,065

(22) Filed: Aug. 25, 2022

(65) Prior Publication Data

US 2023/0231008 A1 Jul. 20, 2023

Related U.S. Application Data

(63) Continuation of application No. PCT/CN2022/100397, filed on Jun. 22, 2022.

(30) Foreign Application Priority Data

Jan. 19, 2022 (CN) .......................... 202210060771.4

(51) Int. Cl.
*H10D 62/10* (2025.01)
*H10B 12/00* (2023.01)
(Continued)

(52) U.S. Cl.
CPC ......... *H10D 62/102* (2025.01); *H10B 12/315* (2023.02); *H10B 12/482* (2023.02);
(Continued)

(58) Field of Classification Search
None
See application file for complete search history.

(56) References Cited

U.S. PATENT DOCUMENTS

2016/0141181 A1* 5/2016 Cho ..................... H10B 12/315
438/301
2021/0351182 A1 11/2021 Yang et al.
(Continued)

FOREIGN PATENT DOCUMENTS

CN 107799523 B 9/2021

OTHER PUBLICATIONS

The Extended European Search Report issued in European corresponding application No. 22921401.0 mailed on 1 Mar. 6, 2025, 9 pages.

*Primary Examiner* — Steven M Page
(74) *Attorney, Agent, or Firm* — Kilpatrick Townsend & Stockton LLP

(57) ABSTRACT

Embodiments provide a semiconductor structure and a fabrication method. The method includes: providing a substrate provided with first trenches and including an active pillar positioned between adjacent two of the first trenches; forming, in the active pillar, a second trench whose bottom is greater than or equal to a bottom of the first trench in height; forming a first dielectric layer and a protective layer in the first trench, the first dielectric layer being positioned between the protective layer and the active pillar, and an upper surface of the first dielectric layer being lower than an upper surface of the active pillar; forming second dielectric layers on an exposed side wall of the first trench and a side wall of the second trench, a third trench being formed between each of the second dielectric layers and the protective layer, and a fourth trench being formed between the second dielectric layers.

20 Claims, 8 Drawing Sheets

(51) Int. Cl.
    *H10D 30/67*        (2025.01)
    *H10D 64/01*        (2025.01)

(52) U.S. Cl.
    CPC ....... *H10B 12/488* (2023.02); *H10D 30/6735*
                 (2025.01); *H10D 64/01* (2025.01)

(56)                References Cited

U.S. PATENT DOCUMENTS

2022/0278106 A1 *  9/2022  Kim ...................... H10B 12/30
2022/0399340 A1 * 12/2022  Kim ..................... H10B 12/485
2024/0292606 A1 *  8/2024  Hua ..................... H10B 12/053

* cited by examiner

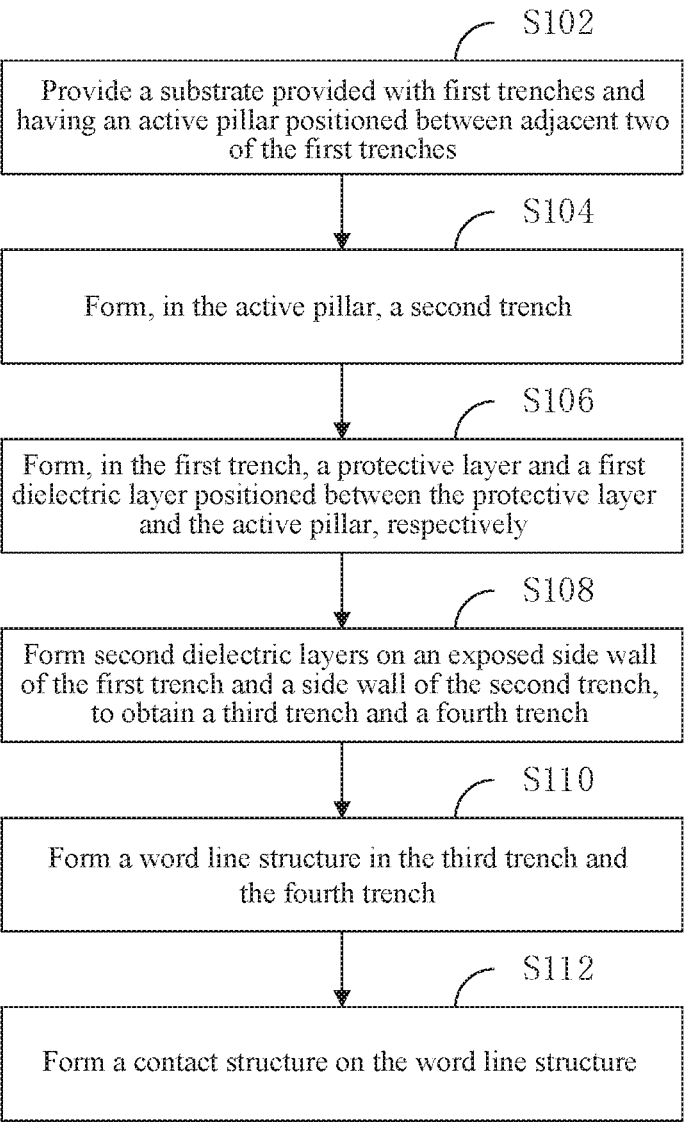

S102

Provide a substrate provided with first trenches and having an active pillar positioned between adjacent two of the first trenches

S104

Form, in the active pillar, a second trench

S106

Form, in the first trench, a protective layer and a first dielectric layer positioned between the protective layer and the active pillar, respectively

S108

Form second dielectric layers on an exposed side wall of the first trench and a side wall of the second trench, to obtain a third trench and a fourth trench

S110

Form a word line structure in the third trench and the fourth trench

S112

Form a contact structure on the word line structure

Form a word line conductive layer in the third trench
and the fourth trench

S504

Form a word line protection layer on the upper
surface of the word line conductive layer

SEMICONDUCTOR STRUCTURE AND FABRICATION METHOD THEREOF

CROSS-REFERENCE TO RELATED APPLICATION

The present disclosure is a continuation of PCT/CN2022/100397, filed on Jun. 22, 2022, which claims priority to Chinese Patent Application No. 202210060771.4 titled "SEMICONDUCTOR STRUCTURE AND FABRICA-TION METHOD THEREOF" and filed to the State Intellectual Property Office on Jan. 19, 2022, the entire contents of which are incorporated herein by reference.

TECHNICAL FIELD

The present disclosure relates to the field of semiconductor technology, and more particularly, to a semiconductor structure and a fabrication method thereof.

BACKGROUND

In a vertical gate-all-around (VGAA) transistor, a trench region of the transistor extends in a direction perpendicular to a surface of a substrate, which is beneficial to improve area utilization of a semiconductor structure having the transistor and implement further reduction of a feature size. As a size of the transistor shrinks, a distance between a source region and a drain region in the VGAA transistor gradually shortens, and capability of a gate in controlling a channel deteriorates, such that subthreshold leakage phenomenon, namely short-channel effect (SCE) is more likely to occur, a channel leakage current of the transistor increases, and thus performance of the transistor is adversely affected. Therefore, how to reduce the channel leakage current of the transistor has become an urgent problem to be solved.

SUMMARY

According to various embodiments of the present disclosure, there are provided a semiconductor structure and a fabrication method thereof.

According to some embodiments, a first aspect of the present disclosure provides a method for fabricating a semiconductor structure. The method includes: providing a substrate, first trenches being formed in the substrate, and the substrate comprising an active pillar positioned between adjacent two of the first trenches; forming a second trench in the active pillar, a bottom of the second trench being greater than or equal to a bottom of the first trench in height; forming a first dielectric layer and a protective layer in the first trench, the first dielectric layer being positioned between the protective layer and the active pillar, and an upper surface of the first dielectric layer being lower than an upper surface of the active pillar to expose a part of a side wall of the first trench; forming second dielectric layers on the exposed side wall of the first trench and a side wall of the second trench, a third trench being formed between each of the second dielectric layers and the protective layer, and a fourth trench being formed between the second dielectric layers; filling the third trench and the fourth trench to form a word line structure; and forming a contact structure on the word line structure, where the contact structure and the protective layer are arranged at intervals, and the contact structure is in contact with the active pillar.

According to some embodiments, the forming a second trench in the active pillar includes: forming a first patterned mask layer on the active pillar, where the first patterned mask layer is configured to define a shape and a position of the second trench; forming a first dielectric material layer on the side wall of the first trench, where the first dielectric material layer extends along the side wall of the first trench to cover a side wall of the first patterned mask layer; forming a protective material layer in the first trench; and removing the first patterned mask layer and at least a part of the active pillar below the first patterned mask layer to form the second trench.

According to some embodiments, an upper surface of the protective material layer is flush with an upper surface of the first patterned mask layer. When removing the first patterned mask layer and at least a part of the active pillar below the first patterned mask layer, the fabrication method further includes: removing a part of the protective material layer, where a remaining part of the protective material layer is the protective layer. Under a same removal condition, a rate of removing the protective material layer is less than a rate of removing the active pillar.

According to some embodiments, a third dielectric layer is formed on the upper surface of the active pillar, and the first patterned mask layer is positioned on an upper surface of the third dielectric layer. The removing the first patterned mask layer and at least a part of the active pillar below the first patterned mask layer includes: removing the first patterned mask layer; removing the third dielectric layer below the first patterned mask layer; and removing at least a part of the active pillar below the first patterned mask layer.

According to some embodiments, the forming a first dielectric layer in the first trench includes: removing a part of the first dielectric material layer adjacent to the upper surface of the active pillar, where a remaining part of the first dielectric material layer is the first dielectric layer.

According to some embodiments, the step of forming second dielectric layers on the exposed side wall of the first trench and a side wall of the second trench includes: forming the second dielectric layers on the side wall of the first trench and the side wall of the second trench by means of a thermal oxidation process.

According to some embodiments, the filling the third trench and the fourth trench to form a word line structure includes: forming a word line conductive layer in the third trench and the fourth trench respectively, where an upper surface of the word line conductive layer is lower than the upper surface of the active pillar; and forming a word line protection layer on the upper surface of the word line conductive layer.

According to some embodiments, the first dielectric layer, the second dielectric layer and the word line protection layer are made of a same material.

According to some embodiments, the upper surface of the word line protection layer is lower than the upper surface of the active pillar.

According to some embodiments, the forming a contact structure on the word line structure includes: forming the contact structure on the word line structure by means of a selective epitaxial growth process.

According to some embodiments, an upper surface of the contact structure is higher than an upper surface of the protective layer, and the method for fabricating a semiconductor structure further includes: forming a spacer on the upper surface of the protective layer, where the spacer covers the upper surface of the contact structure.

According to some embodiments, the forming a second dielectric layer on the side wall of the second trench includes: forming the second dielectric layer at a bottom of the second trench.

The present disclosure also provides a semiconductor structure, including a substrate, a second trench, a protective layer, a first dielectric layer, a second dielectric layer, a word line structure, and a contact structure. First trenches are formed in the substrate, where the substrate includes an active pillar positioned between adjacent two of the first trenches. The second trench is formed in the active pillar, and a bottom of the second trench is greater than or equal to a bottom of the first trench in height. The protective layer is positioned in the first trench. The first dielectric layer is positioned between the protective layer and the active pillar, and an upper surface of the first dielectric layer is lower than an upper surface of the active pillar to expose a part of a side wall of the first trench. The second dielectric layer is positioned on the exposed side wall of the first trench and a side wall of the second trench, a third trench is formed between the second dielectric layer and the protective layer, and a fourth trench is formed between the second dielectric layers. The word line structure is positioned in the third trench and the fourth trench. The contact structure is positioned on the word line structure, and the contact structure is arranged at intervals with the protective layer and is in contact with the active pillar.

According to some embodiments, the second trench is positioned in a center of the active pillar.

According to some embodiments, the word line structure includes a word line conductive layer and a word line protection layer. The word line conductive layer is positioned in the third trench and the fourth trench, and an upper surface of the word line conductive layer is lower than the upper surface of the active pillar. The word line protection layer is positioned on the upper surface of the word line conductive layer.

According to some embodiments, the first dielectric layer, the second dielectric layer and the word line protection layer are made of a same material.

According to some embodiments, the upper surface of the word line protection layer is lower than the upper surface of the active pillar.

According to some embodiments, an upper surface of the contact structure is higher than an upper surface of the protective layer, and the semiconductor structure further includes a spacer, which is positioned on the upper surface of the protective layer and the upper surface of the contact structure.

The embodiments of the present disclosure may at least have following advantages.

In the semiconductor structure and the fabrication method thereof provided by the embodiments of the present disclosure, the first trenches are formed in the substrate, the second trench is formed in the active pillar between adjacent two of the first trenches, the second dielectric layers are formed on the side wall of the first trench close to an opening and on the side wall of the second trench to obtain the third trench positioned between the second dielectric layer and the protective layer in the first trench and the fourth trench positioned between adjacent two of the second dielectric layers in the second trench. A word line structure is formed in the third trench and the fourth trench, the contact structure arranged at intervals with the protective layer and coming in contact with the active pillar is formed on the word line structure, the word line structure in the third trench and the word line structure in the fourth trench may be used as the gate structure of the transistor at the same time. The active pillars on two sides of the second trench may be connected at the same time by means of the contact structure, thereby improving control capability of the gate structure, reducing leakage current of the semiconductor structure, improving leakage characteristic of the semiconductor structure, and also reducing resistance of the word line structure and contact resistance between the subsequent capacitor structure and the transistor.

In conclusion, the semiconductor structure and the fabrication method thereof provided by the embodiments of the present disclosure can optimize capability of a gate in controlling a channel, and achieve the objective of reducing channel leakage current of the transistor.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 1 is a schematic flowchart of a method for fabricating a semiconductor structure according to an embodiment;

FIG. 8b is a schematic top view corresponding to FIG. 8a;

FIG. 11b is a schematic top view corresponding to FIG. 11a; and

FIG. 12 is a schematic cross-sectional view of a semiconductor structure obtained after a contact structure is formed according to an embodiment corresponding to FIG. 11a.

DETAILED DESCRIPTION

Figure 2:
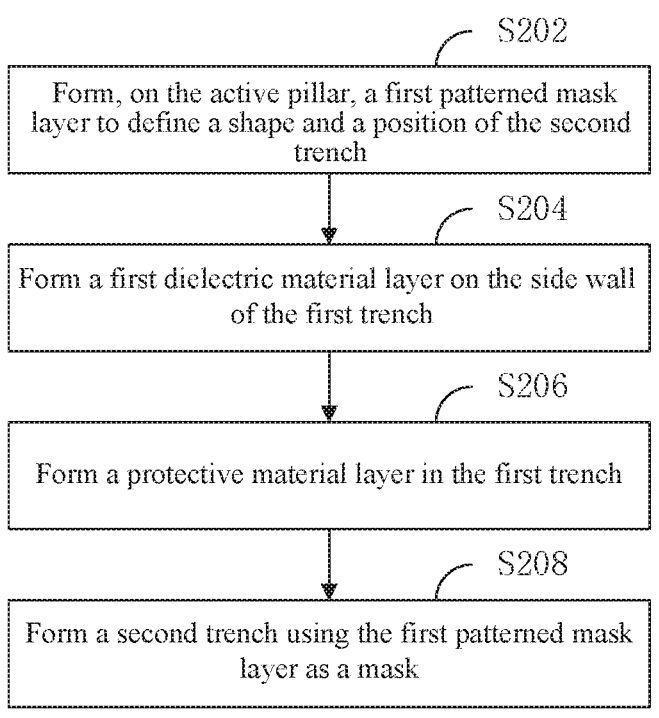
FIG. 2 is a schematic flowchart of Step S104 according to an embodiment.

For ease of understanding the embodiments of the present disclosure, the embodiments of the present disclosure will be described more fully hereinafter with reference to the accompanying drawings. Some embodiments among the embodiments of the present disclosure are provided in the accompanying drawings. However, the embodiments of the present disclosure may be embodied in many different forms and should not be limited to the embodiments set forth herein. Rather, these embodiments are provided such that disclosed contents of the embodiments of the present disclosure will be more thorough and complete.

Unless otherwise defined, all technical and scientific terms employed herein have the same meaning as commonly understood by those skilled in the art to which the embodiments of the present disclosure belong. The terms employed in the specification of the embodiments of the present disclosure are merely for the purpose of describing some embodiments and are not intended for limiting the embodiments of the present disclosure. As used herein, the term "and/or" includes any and all combinations of one or more of the associated listed items.

In the description of the embodiments of the present disclosure, it is to be understood that the orientations or positions represented by the terms of "up", "down", "vertical", "horizontal", "in", "out", and the like are based on the orientations or positions as shown in the accompanying figures, they are merely for ease of a description of the embodiments of the present disclosure and a simplified description instead of being intended to indicate or imply the device or element to have a special orientation or to be configured and operated in a special orientation. Thus, they cannot be interpreted as limiting of the embodiments of the present disclosure.

It is to be understood that the terms "first", "second", etc. used in the present disclosure may be used herein to describe various elements, but these elements are not limited by these terms. These terms are only intended for distinguishing a first element from another one. For example, a first trench may be referred to as a second trench, and similarly, the second trench may be referred to as the first trench without departing from the scope of the present disclosure. Both the first trench and the second trench are trenches, but they are not the same trench.

In addition, terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, for example, two, three, etc., unless otherwise expressly specified. In the description of the present disclosure, "a number of" refers to at least one, for example, one, two, etc., unless otherwise expressly specified.

FIG. 1 is a schematic flowchart of a method for fabricating a semiconductor structure according to an embodiment. In this embodiment, there is provided a method for fabricating a semiconductor structure, including:

S102, providing a substrate having first trenches and an active pillar between adjacent two of the first trenches.

In some embodiments, the substrate is provided, and the first trenches are formed in the substrate, where the substrate includes the active pillar positioned between adjacent two of the first trenches. The substrate may use undoped monocrystalline silicon, monocrystalline silicon doped with impurities, silicon-on-insulator (SOI), stacked silicon-on-insulator (SSOI), stacked silicon-germanium-on-insulator (S-SiGeOI), silicon-germanium-on-insulator (SiGeOI), and germanium-on-insulator (GeOI), etc. The substrate may also be made of a semiconductor material, such as one or more of silicon, germanium, a silicon germanium compound, and a silicon carbon compound. As an example, in this embodiment, monocrystalline silicon is selected as a constituent material of the substrate.

S104, forming a second trench in the active pillar.

In some embodiments, the second trench is formed in the active pillar by means of a trenching process well known to those skilled in the art, and a bottom of the second trench is greater than or equal to a bottom of the first trench in height.

S106, respectively forming, in the first trench, a protective layer and a first dielectric layer positioned between the protective layer and the active pillar.

In some embodiments, the first dielectric layer and the protective layer are formed in the first trench respectively, where the first dielectric layer is positioned between the protective layer and the active pillar, and an upper surface of the first dielectric layer is lower than an upper surface of the active pillar, thereby exposing a part of a side wall of the first trench. It is to be understood that the first dielectric layer is positioned on a side wall of the first trench distant from an opening, the side wall of the first trench close to the opening is exposed and is not covered by the first dielectric layer, and the protective layer fills up a space between adjacent two of the first dielectric layers on the side wall of the first trench. Exemplarily, the first dielectric layer may extend along the side wall of the first trench to cover the bottom of the first trench, or may only cover the side wall of the first trench distant from the opening, and an upper surface of the protective layer is greater than or equal to the upper surface of the active pillar in height.

S108, forming second dielectric layers on the exposed side wall of the first trench and a side wall of the second trench to obtain a third trench and a fourth trench.

The second dielectric layers are formed on the exposed side wall of the first trench and the side wall of the second trench, the third trench is formed between each of the second dielectric layers and the protective layer, and the fourth trench is formed between adjacent two of the second dielectric layers. In some embodiments, the second dielectric layers are formed on the side wall of the first trench that is close to the opening and is not covered by the first dielectric layer and on the side wall of the second trench, and the second dielectric layer in the first trench close to the opening is in contact with the first dielectric layer. Moreover, a gap between the second dielectric layer in the first trench and the protective layer in the first trench is the third trench, and the second dielectric layers on the side wall of the second trench are isolated from each other to form the fourth trench in the second trench.

S110, filling the third trench and the fourth trench to form a word line structure.

In some embodiments, the word line structure is formed by filling the third trench and the fourth trench, and the word line structure may be used as a gate structure of the transistor, thereby improving control capability of the gate structure, reducing leakage current of the semiconductor structure, improving leakage characteristics of the semiconductor structure, and reducing resistance of the word line structure.

S112, forming a contact structure on the word line structure.

In some embodiments, the contact structure is formed on the word line structure, where the contact structure and the protective layer are arranged at intervals, and the contact structure is in contact with the active pillar. It is to be understood that the contact structure is positioned on the active pillar between adjacent two of the first trenches and is in contact with the active pillar between the first trench and the second trench. The active pillars on two sides of any one of the second trenches may be connected at the same time by means of the contact structure, thereby reducing contact resistance between a subsequent capacitor structure and the transistor.

In the above method for fabricating a semiconductor structure, the first trenches are formed in the substrate, the second trench is formed in the active pillar between adjacent two of the first trenches, the second dielectric layers are formed on the side wall of the first trench close to an opening and on the side wall of the second trench to obtain the third trench positioned between the second dielectric layer and the protective layer in the first trench and the fourth trench positioned between adjacent two of the second dielectric layers in the second trench. A word line structure is formed in the third trench and the fourth trench, the contact structure arranged at intervals with the protective layer and coming in contact with the active pillar is formed on the word line structure, the word line structure in the third trench and the word line structure in the fourth trench may be used as the gate structure of the transistor at the same time. The active pillars on two sides of the second trench may be connected at the same time by means of the contact structure, thereby improving control capability of the gate structure, reducing leakage current of the semiconductor structure, improving leakage characteristic of the semiconductor structure, and also reducing resistance of the word line structure and contact resistance between the subsequent capacitor structure and the transistor.

Figure 3:
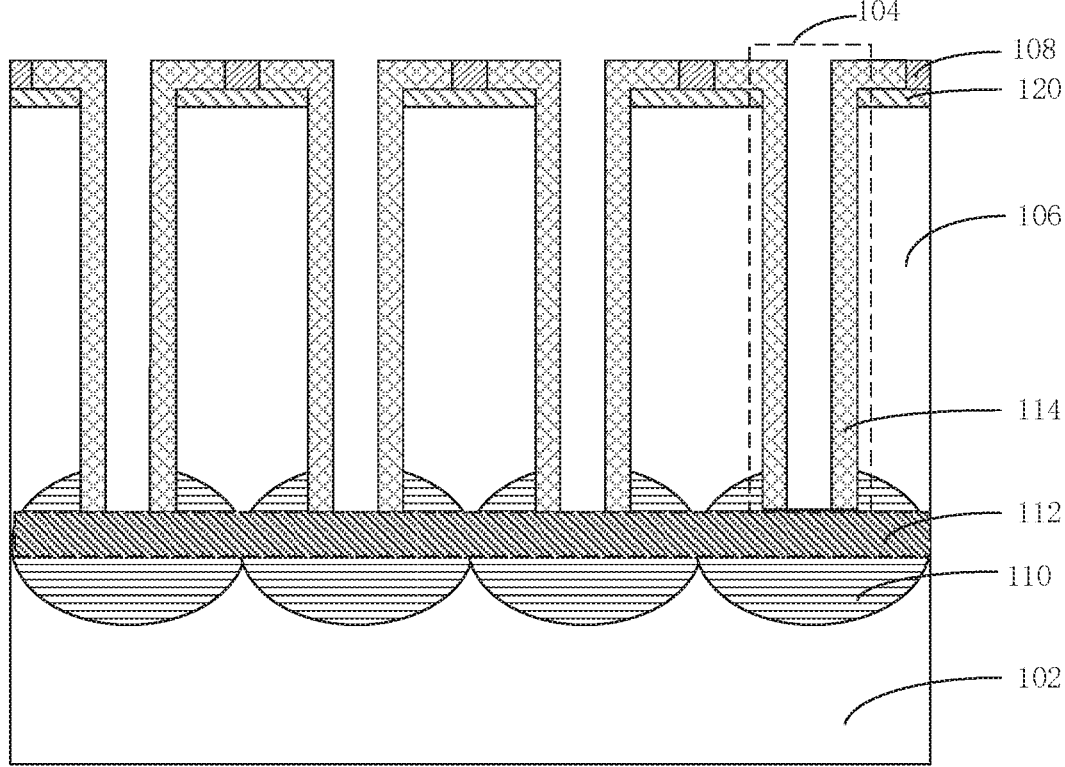
FIG. 3 is a schematic cross-sectional view of a semiconductor structure obtained after a first dielectric material layer is formed according to an embodiment.
Figure 4:
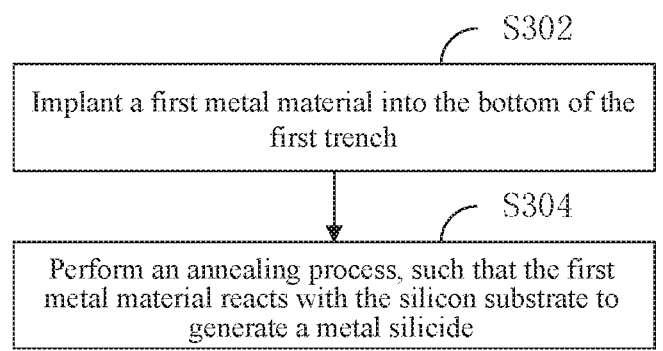
FIG. 4 is a schematic flowchart of a method for fabricating a semiconductor structure according to another embodiment.
Figure 5:
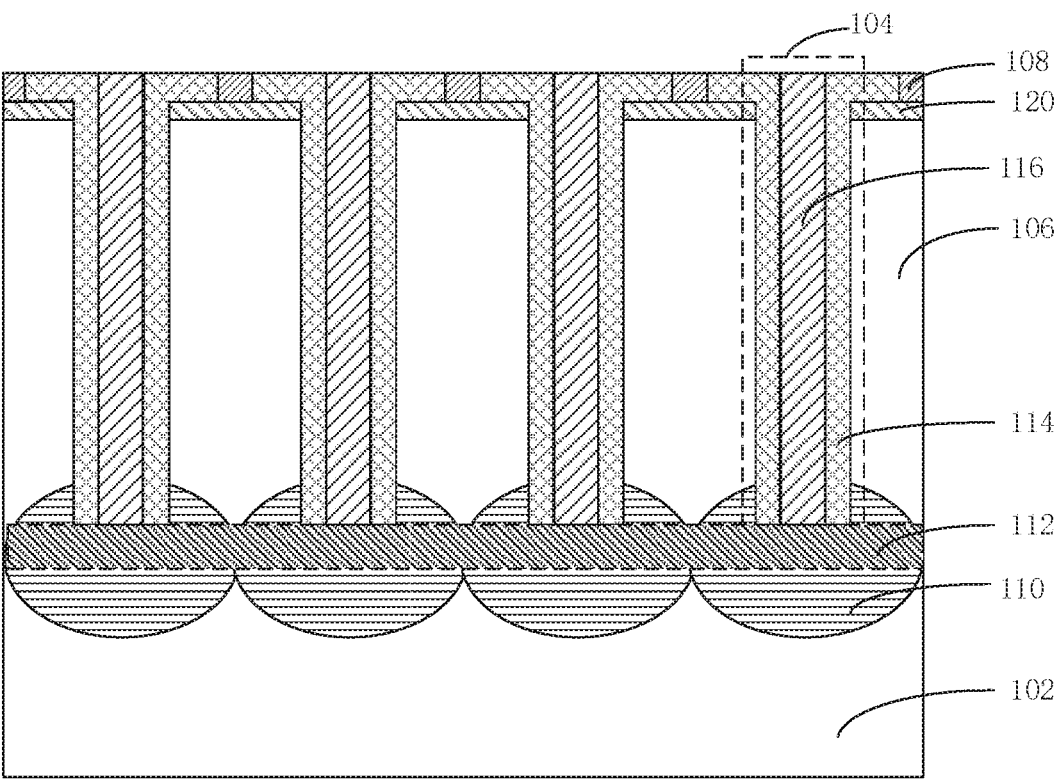
FIG. 5 is a schematic cross-sectional view of a semiconductor structure obtained after a protective material layer is formed according to an embodiment corresponding to FIG. 3.
Figure 6:
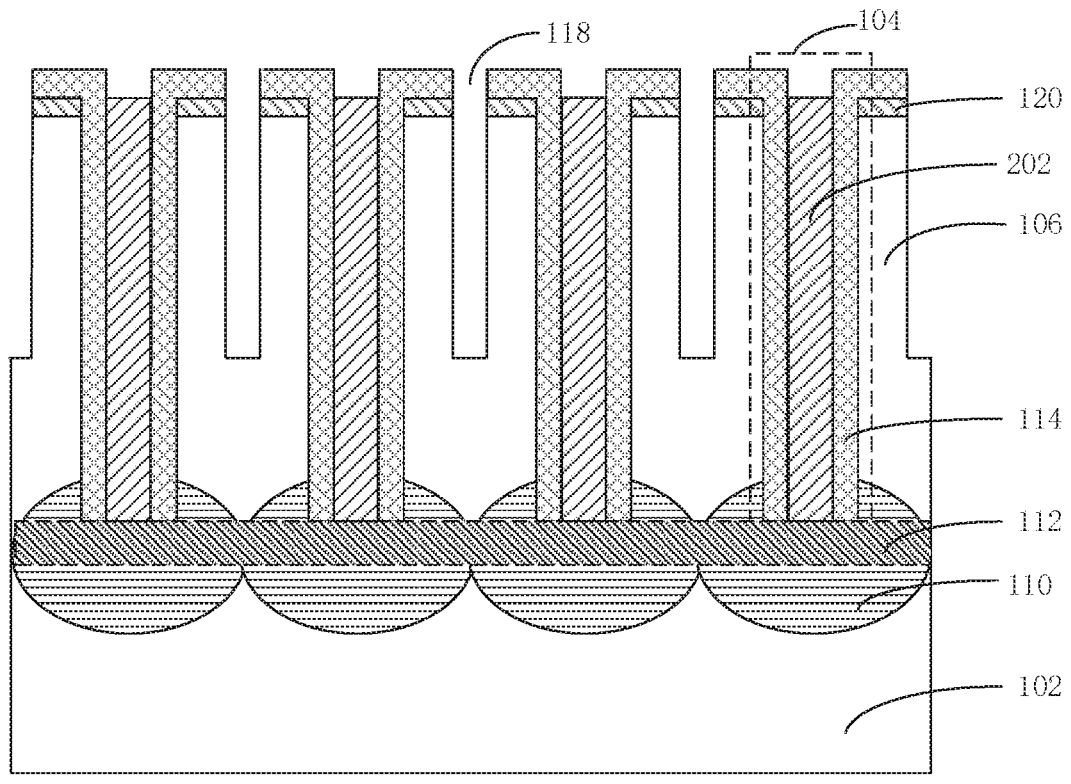
FIG. 6 is a schematic cross-sectional view of the semiconductor structure obtained after a second trench is formed according to an embodiment corresponding to FIG. 5.

FIG. 2 is a schematic flowchart of Step S104 according to an embodiment; FIG. 3 is a schematic cross-sectional view of a semiconductor structure obtained after a first dielectric material layer is formed according to an embodiment; FIG. 4 is a schematic flowchart of a method for fabricating a semiconductor structure according to another embodiment; FIG. 5 is a schematic cross-sectional view of a semiconductor structure obtained after a protective material layer is formed according to an embodiment corresponding to FIG. 3; and FIG. 6 is a schematic cross-sectional view of the semiconductor structure obtained after a second trench is formed according to an embodiment corresponding to FIG. 5. As shown in FIG. 2, FIG. 3, FIG. 4, FIG. 5, and FIG. 6, in one embodiment, Step S104 includes:

S202, forming, on the active pillar, a first patterned mask layer to define a shape and a position of the second trench.

As shown in FIG. 3, the substrate 102 having the first trench 104 is provided first, and then a first patterned mask layer 108 is formed on the active pillar 106, where the first patterned mask layer 108 is configured to define the shape and the position of the second trench. Exemplarily, a constituent material of the first patterned mask layer 108 includes one or more of a nitride, an oxide, and an oxynitride, such as silicon dioxide, silicon nitride, and silicon oxynitride.

As shown in FIG. 3 and FIG. 4, in one embodiment, the substrate 102 includes a silicon substrate, and the bottom of the first trench 104 exposes a part of the silicon substrate. Before Step S202, the method further includes:

S302, implanting a first metal material into the bottom of the first trench.

In some embodiments, the first metal material is implanted into the silicon substrate exposed at the bottom of the first trench 104 by means of an ion implantation process, where an implantation angle, an implantation depth and an implantation dose of the ion implantation process are set according to actual needs. Exemplarily, the first metal material includes one or more of tungsten, aluminum, titanium, and cobalt.

S304, performing an annealing process, such that the first metal material reacts with the silicon substrate to generate a metal silicide.

The annealing process such as a rapid thermal annealing process or an plasma annealing process is performed, such that the first metal material implanted into the silicon substrate reacts with the silicon substrate to form the metal silicide 110, where the metal silicides 110 at the bottoms of adjacent two of the first trenches 104 contact to obtain a bit line structure 112 in the substrate. It is to be understood that the substrate 102 may also be a substrate formed of other semiconductor materials, and in this case, the first metal material may also react with the substrate to generate a corresponding metal silicide.

S204, forming a first dielectric material layer on the side wall of the first trench.

Still referring to FIG. 3, a first dielectric material layer 114 is formed on the side wall of the first trench 104, where the first dielectric material layer 114 extends along the side wall of the first trench 104 to cover the side wall of the first patterned mask layer 108.

In one embodiment, an upper surface of the first dielectric material layer 114 is flush with that of the first patterned mask layer 108, and the first dielectric material layer 114 extends along the side wall of the first trench 104 to cover the bottom of the first trench 104, and in this case, the first dielectric material layer 114 at the bottom of the first trench 104 may be retained or may be removed. It is to be understood that when Steps S302-S304 occur after Step S204, the first dielectric material layer 114 at the bottom of the first trench 104 needs to be removed.

In another embodiment, the first dielectric material layer 114 extends along the side wall of the first patterned mask layer 108 to cover the upper surface of the first patterned mask layer 108, and the first dielectric material layer 114 extends along the side wall of the first trench 104 to cover the bottom of the first trench 104. In this case, the first dielectric material layer 114 above the upper surface of the first patterned mask layer 108 needs to be removed, and the first dielectric material layer 114 at the bottom of the first trench 104 may be partially or completely removed along with the first dielectric material layer 114 on the upper surface of the first patterned mask layer 108. When the first dielectric material layer 114 at the bottom of the first trench 104 is partially removed, the first dielectric material layer 114 remained at the bottom of the first trench 104 may be removed or retained again as required by the process, and an exemplary description is made below by taking an example where the first dielectric material layer 114 is not remained at the bottom of the first trench 104. Exemplarily, a constituent material of the first dielectric material layer 114 includes one or more of a nitride, an oxide and an oxynitride, such as silicon dioxide, silicon nitride, and silicon oxynitride.

S206, forming a protective material layer in the first trench.

As shown in FIG. 5, the first trench 104 is filled up with a protective material layer 116. That is, a part of the first trench 104 where the first dielectric material layer 106 is not formed is filled up with the protective material layer 116. Exemplarily, a constituent material of the protective material layer 116 includes one or more of a nitride, an oxide and an oxynitride, such as silicon dioxide, silicon nitride, and silicon oxynitride. It is to be understood that the constituent material of the protective material layer 116 and the constituent material of the first patterned mask layer 108 may be the same or may be different. For example, the constituent material of the protective material layer 116 and the constituent material of the first patterned mask layer 108 are both silicon nitride.

S208, forming a second trench using the first patterned mask layer as a mask.

As shown in FIG. 6, the first patterned mask layer 108 and at least a part of the active pillar 106 below the first patterned mask layer 108 are removed using the first patterned mask layer 108 as a mask by means of an etching process (dry etching or/and wet etching), to form the second trench 118.

As shown in FIG. 5 and FIG. 6, in one embodiment, the upper surface of the protective material layer 116 is flush with that of the first patterned mask layer 108. When removing the first patterned mask layer 108 and at least a part of the active pillar 106 below the first patterned mask layer 108, the method further includes: removing a part of the protective material layer 116, a remaining part of the protective material layer 116 being the protective layer 202; where, under the same removal condition, the rate of removing the protective material layer 116 is less than that of removing the active pillar 106.

As shown in FIG. 3, FIG. 5 and FIG. 6, in one embodiment, the method for fabricating a semiconductor structure further includes: forming a third dielectric layer 120 on the substrate 102. The third dielectric layer 120 may protect the substrate 102 (the active pillar) between adjacent two of the first trenches 104, thereby preventing the performance of the substrate 102 (the active pillar) between adjacent two of the first trenches 104 from being adversely affected during the formation of the metal silicide 110. Exemplarily, a constituent material of the third dielectric layer 120 includes one or more of a nitride, an oxide and an oxynitride, such as silicon dioxide, silicon nitride, and silicon oxynitride. It is to be understood that at least one of the third dielectric layer 120, the protective material layer 116 and the first patterned mask layer 108 may be different from the others in constituent material, or none of the third dielectric layer 120, the protective material layer 116 and the first patterned mask layer 108 may be the same in constituent material. For example, the constituent material of the third dielectric layer 120 is silicon dioxide.

Figure 7:
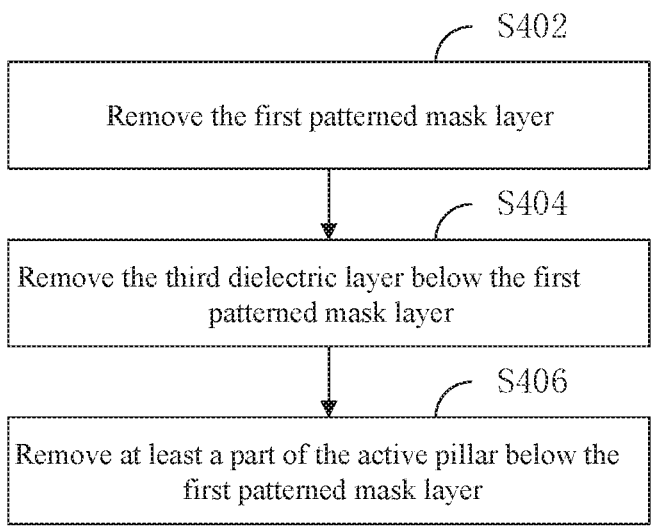
FIG. 7 is a schematic flowchart of removing a first patterned mask layer and at least part of an active pillar below the first patterned mask layer according to an embodiment.

FIG. 7 is a schematic flowchart of removing a first patterned mask layer and at least part of an active pillar below the first patterned mask layer according to an embodiment. As shown in FIG. 5, FIG. 6, and FIG. 7, in one embodiment, the third dielectric layer 120 is formed on the upper surface of the active pillar 106, and the first patterned mask layer 108 is positioned on the upper surface of the third dielectric layer 120. The removing the first patterned mask layer 108 and at least a part of the active pillar 106 below the first patterned mask layer 108 includes:

S402, removing the first patterned mask layer.

S404, removing the third dielectric layer below the first patterned mask layer.

S406, removing at least a part of the active pillar below the first patterned mask layer.

Figure 8A:
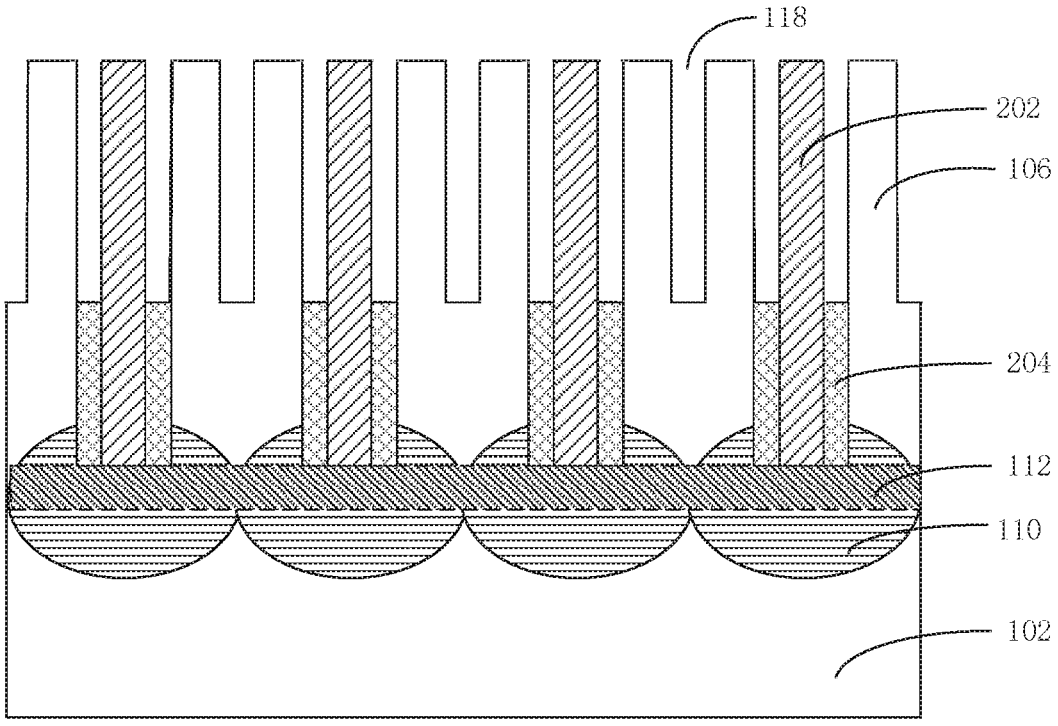
FIG. 8a is a schematic cross-sectional view of the semiconductor structure obtained after a first dielectric layer is formed according to an embodiment corresponding to FIG. 6.
Figure 8B:
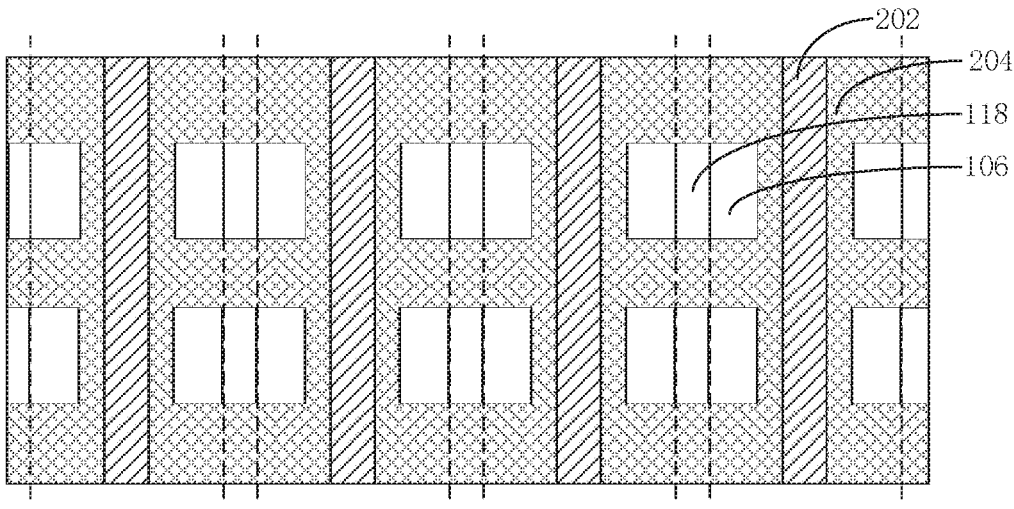

FIG. 8a is a schematic cross-sectional view of the semiconductor structure obtained after a first dielectric layer is formed according to an embodiment corresponding to FIG. 6; and FIG. 8b is a schematic top view corresponding to FIG. 8a. In one embodiment, the forming a first dielectric layer 204 in the first trench 104 includes: removing a part of the first dielectric material layer 114 adjacent to the upper surface of the active pillar 106, a remaining part of the first dielectric material layer 114 being the first dielectric layer 204. As shown in FIG. 8a and FIG. 8b, a part of the first dielectric material layer 114 adjacent to the upper surface of the active pillar 106 is removed by means of a dry etching process and/or a wet etching process, and at the same time, the first dielectric material layer 114 extending along the first trench 104 to cover the active pillar 106 is also completely removed, and the remaining part of the first dielectric material layer 114 is the first dielectric layer 204. It is to be understood that when the third dielectric layer 120 is formed on the active pillar 106, the third dielectric layer 120 protects the active pillar 106 between adjacent two of the first trenches 104 when removing a part of the first dielectric material layer 114 adjacent to the upper surface of the active pillar 106, and at the same time, the third dielectric layer 120 may be removed together with a part of the first dielectric material layer 114 adjacent to the upper surface of the active pillar 106, or may be removed after removing the part of the first dielectric material layer 114 adjacent to the upper surface of the active pillar 106.

In one embodiment, the upper surface of the first dielectric layer 204 is flush with a lower surface of the second trench 118.

Figure 9:
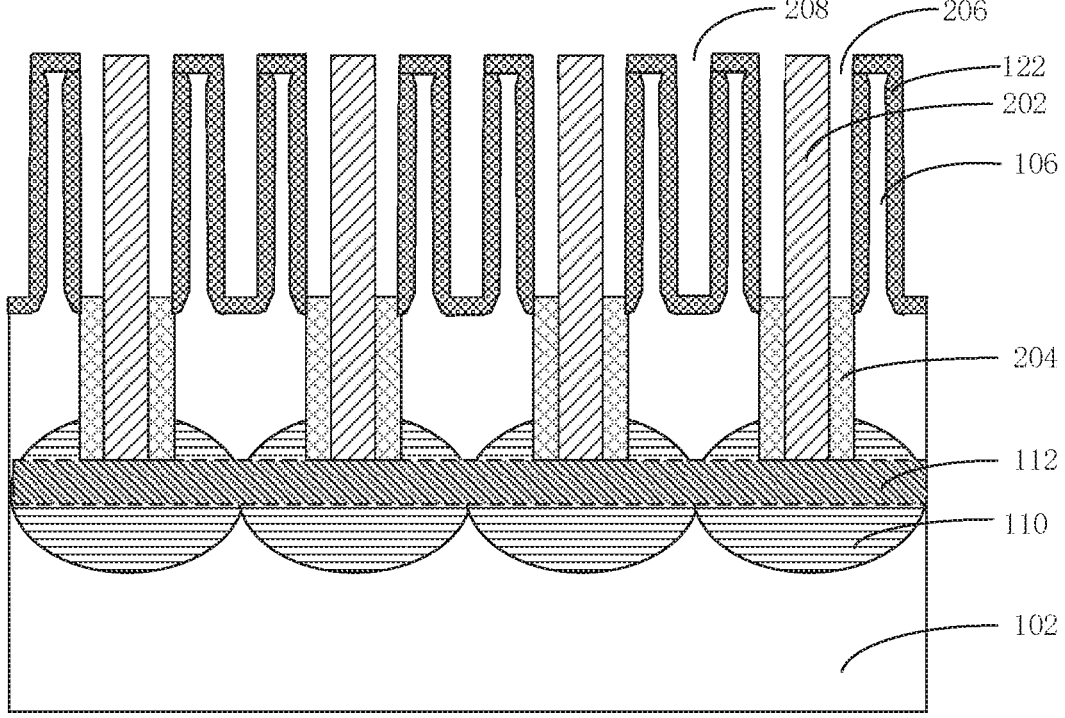
FIG. 9 is a schematic cross-sectional view of the semiconductor structure obtained after a second dielectric layer is formed according to an embodiment.

FIG. 9 is a schematic cross-sectional view of the semiconductor structure obtained after a second dielectric layer is formed according to an embodiment. After the second dielectric layers 122 are formed on the side wall of the active pillar 106 exposed in the first trench 104 and the side wall of the active pillar 106 exposed in the second trench 118, the third trench 206 is formed between the second dielectric layer 122 on the side wall of the first trench 104 and the protective layer 202, and the fourth trench 208 is formed between adjacent two of the second dielectric layers 122 on the side wall of the second trench 118. As shown in FIG. 9, in one embodiment, the step of forming the second dielectric layers 122 on the side wall of the active pillar 106 exposed in the first trench 104 and the side wall of the active pillar 106 exposed in the second trench 118 includes: forming second dielectric layers 122 on the side wall of the active pillar 106 exposed in the first trench 104 and the side wall of the active pillar 106 exposed in the second trench 118 by means of a thermal oxidation process. Exemplarily, the substrate 102 (including the active pillar 106) may be made of a semiconductor material, which may be one or more of silicon, germanium, a silicon-germanium compound, and a silicon-carbon compound. The second dielectric layer 122 may be an oxide layer obtained from the active pillar 106 by means of the thermal oxidation process, to serve as a gate oxide layer. For example, when the active pillar 106 is made of a silicon semiconductor material, the second dielectric layer 122 formed is made of silicon dioxide. In another example, when the active pillar 106 is made of a germanium semiconductor material, the second dielectric layer 122 formed is made of germanium oxide.

In one embodiment, still referring to FIG. 9, the second dielectric layer 122 extends along the side wall of the first trench 104 and the side wall of the second trench 118 to cover the active pillar 106. For example, the second dielectric layer 122 extends along the side wall of the first trench 104 and the side wall of the second trench 118 to cover the surface of the active pillar 106.

In one embodiment, the forming a second dielectric layer 122 on the side wall of the second trench 118 includes: forming the second dielectric layer 122 at the bottom of the second trench 118. That is, the second dielectric layer 122 extends along the side wall of the second trench 118 to cover the bottom of the second trench 118. It is to be understood that when the bottom of the second trench 118 is flush with the upper surface of the bit line structure 112, the bit line structure 112 and the word line structure subsequently formed in the second trench 118 may be isolated by means of the second dielectric layer 122 at the bottom of the second trench 118. When the bottom of the second trench 118 is higher than the upper surface of the bit line structure 112, the second dielectric layer 122 may be formed or may not be formed at the bottom of the second trench 118. Exemplarily, a constituent material of the second dielectric layer 122 includes one or more of a nitride, an oxide and an oxynitride, such as silicon dioxide, silicon nitride, and silicon oxynitride. For example, the constituent material of the second dielectric layer 122 is silicon dioxide. It is to be understood that the constituent material of the second dielectric layer 122 and the constituent material of the first dielectric layer 204 may be the same or may be different.

Figure 10:
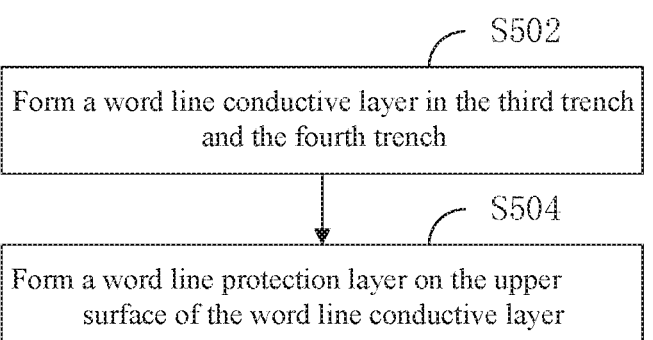
FIG. 10 is a schematic flowchart of Step S110 in an embodiment.
Figure 11A:
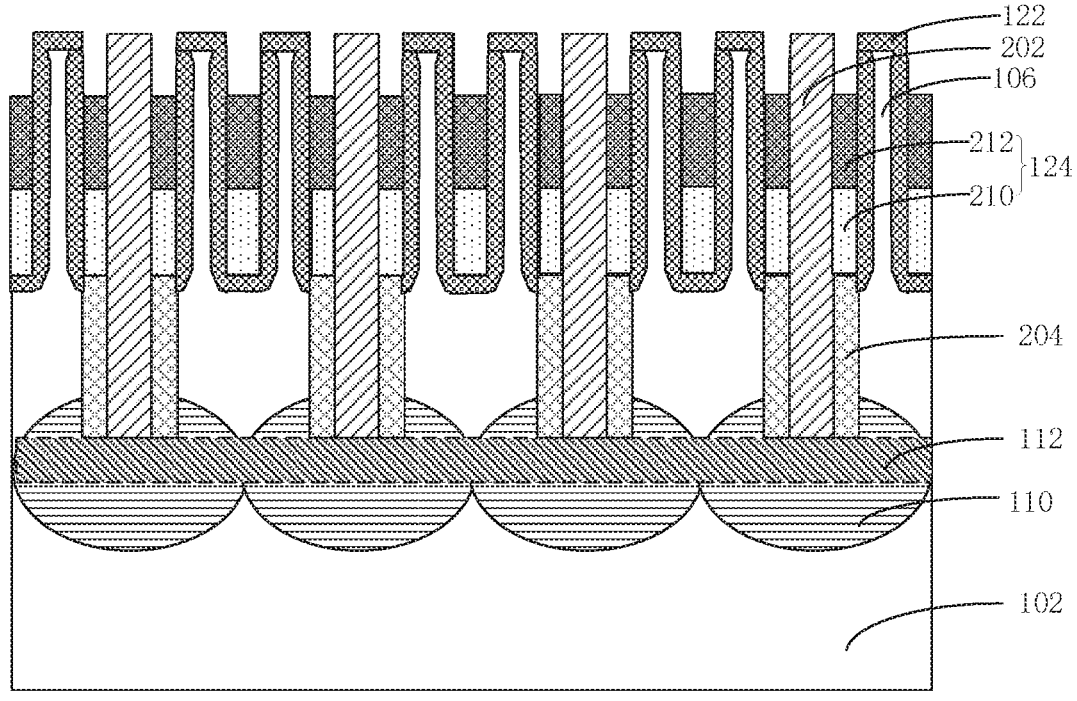
FIG. 11a is a schematic cross-sectional view of a semiconductor structure obtained after a word line structure is formed according to an embodiment corresponding to FIG. 9.
Figure 11B:
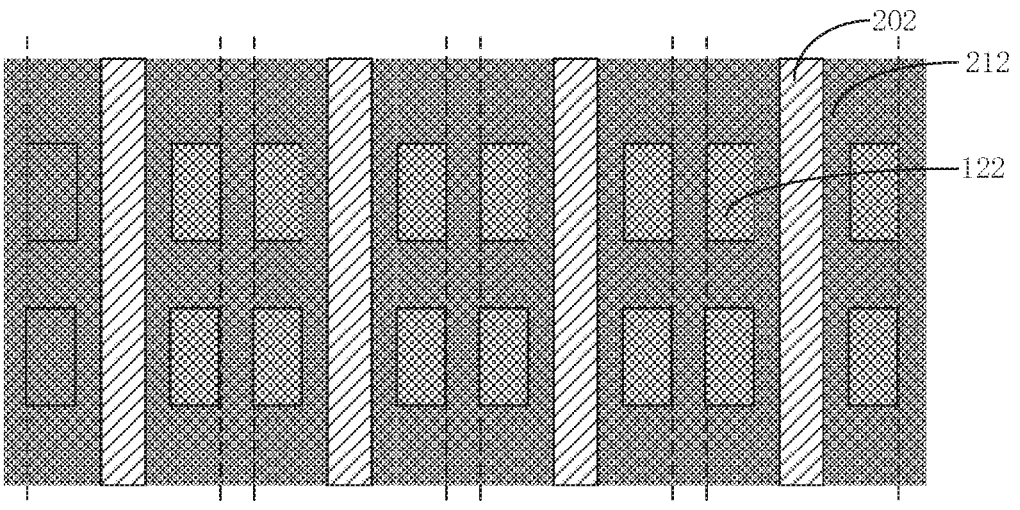

FIG. 10 is a schematic flowchart of Step S110 in an embodiment; FIG. 11*a* is a schematic cross-sectional view of the semiconductor structure obtained after the word line structure is formed according to an embodiment corresponding to FIG. 9; and FIG. 11*b* is a schematic top view corresponding to FIG. 11*a*. As shown in FIG. 10, FIG. 11*a* and FIG. 11*b*, in one embodiment, the filling the third trench 206 and the fourth trench 208 to form the word line structure 124 includes:

S502, filling the third trench and the fourth trench to form a word line conductive layer.

As shown in FIG. 11*a* and FIG. 11*b*, the word line conductive layer 210 is formed in the third trench 206 and the fourth trench 208, and an upper surface of the word line conductive layer 210 is lower than the upper surface of the active pillar 106. In some embodiments, a word line conductive material layer is first formed by filling the third trench 206 and the fourth trench 208. Exemplarily, an upper surface of the word line conductive material layer is higher than that of the active pillar 106. After a deposition process, the word line conductive material layer with a flat surface is obtained by means of a chemical mechanical polishing process, to eliminate adverse effects of surface flatness of the word line conductive material layer on surface flatness of the word line conductive layer 210. Exemplarily, a constituent material of the word line conductive material layer includes a metal material, a metal nitride material, a polycrystalline silicon material, etc., such as titanium, tungsten, copper, aluminum, titanium nitride, and polycrystalline silicon. Next, a redundant part of the word line conductive material layer is removed by means of an etching process, and a remaining part of the word line conductive material layer is the word line conductive layer 210.

S504, forming a word line protection layer on the upper surface of the word line conductive layer.

Still referring to FIG. 11*a* and FIG. 11*b*, the word line protective layer 212 is formed on the upper surface of the word line conductive layer 210. In some embodiments, the word line protective material layer is first formed on the upper surface of the word line conductive layer 210. Exemplarily, the upper surface of the word line protection material layer is higher than the upper surface of the active pillar 106. After the deposition process, the word line protection material layer with a flat surface is obtained by means of a chemical mechanical polishing process, to eliminate the adverse effects of the surface flatness of the word line protection material layer on the surface flatness of the word line protection layer 212. Exemplarily, a constituent material of the word line protection material layer includes one or more of a nitride, an oxide and an oxynitride, such as silicon dioxide, silicon nitride, and silicon oxynitride. Next, a redundant part of the word line protection material layer is removed by means of an etching process, and a remaining part of the word line protection material layer is the word line protection layer 212.

In one embodiment, the first dielectric layer 204, the second dielectric layer 122 and the word line protection layer 212 are made of the same material. In other embodiments, at least one of the first dielectric layer 204, the second dielectric layer 122 and the word line protection layer 212 is different from the others in constituent material.

In one embodiment, the upper surface of the word line protection layer 212 is lower than that of the active pillar 106. In other embodiments, the upper surface of the word line protection layer 212 is greater than or equal to the upper surface of the active pillar 106 in height.

Figure 12:
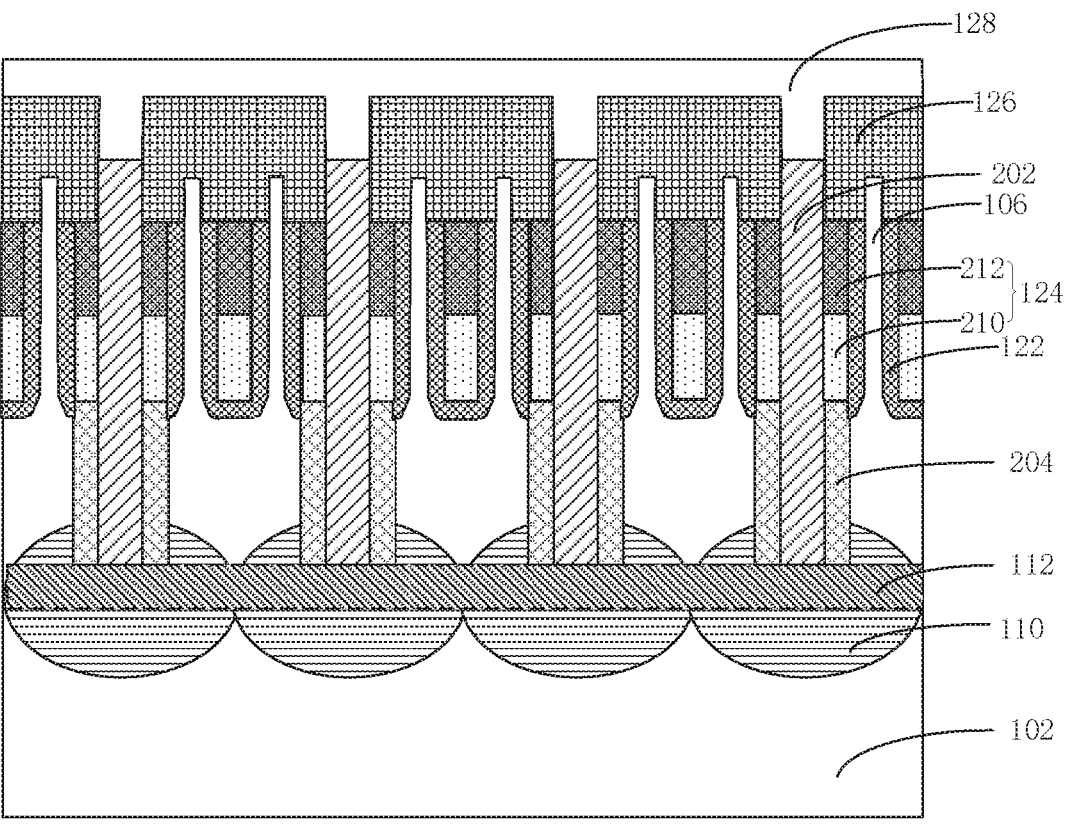

FIG. 12 is a schematic cross-sectional view of a semiconductor structure obtained after a contact structure is formed according to an embodiment corresponding to FIG. 11*a*. As shown in FIG. 12, in one embodiment, the forming a contact structure 126 on the word line structure 124 includes: forming the contact structure 126 on the word line structure 124 by means of a selective epitaxial growth process. Exemplarily, a constituent material of the contact structure 126 is polycrystalline silicon.

In one embodiment, the method for fabricating a semiconductor structure further includes: removing the second dielectric layer 122 on the active pillar 106, such that the surface of the active pillar 106 may be exposed by means of this step. In another embodiment, the method for fabricating a semiconductor structure further includes: removing the second dielectric layer 122 above the upper surface of the word line protection layer 212 to obtain the second dielectric layer 122 having an upper surface flush with the upper surface of the word line structure 124. In this way, a contact area between the contact structure 126 and the active pillar 106 may be increased, and a contact resistance may be reduced.

In one embodiment, the upper surface of the contact structure 126 is higher than the upper surface of the protective layer 202. The method for fabricating a semiconductor structure further includes: forming a spacer 128 on the upper surface of the protective layer 202, where the spacer 128 covers the upper surface of the contact structure 126.

In one embodiment, the spacer 128 and the protective layer 202 are made of the same material.

In one embodiment, the method for fabricating a semiconductor structure further includes: forming a source region and a drain region in the active pillar 106 between adjacent two of the second dielectric layers 122, where a part of the active pillar 106 parallel to the word line structure 124 between adjacent two of the second dielectric layers 122 is a drift region, where a first part between the drift region and the bit line structure 112 and a second part between the drift region and the upper surface of the active pillar 106 are the source region and the drain region, respectively. For example, the first part between the drift region and the bit line structure 112 is the drain region, and the second part between the drift region and the upper surface of the active pillar 106 is the source region. It is to be understood that the source region and the drain region are formed before the formation of the word line structure 124, that is, the source region and the drain region are formed before the formation of the bit line structure 112.

In one embodiment, the method for fabricating a semiconductor structure further includes: forming a capacitor structure (not shown in the figure) on the spacer 128. The capacitor structure is electrically connected to the contact structure 126 by means of a conductive structure penetrating through the spacer 128, and then is further electrically connected to a device region on the upper surface of the active pillar 106 between adjacent two of the second dielectric layers 122 by means of the contact structure 126.

It is to be understood that although the various steps in the flowcharts of FIG. 1, FIG. 2, FIG. 4, FIG. 7 and FIG. 10 are displayed in sequence as indicated by the arrows, these steps are not necessarily performed in sequence in the order indicated by the arrows. Unless expressly stated herein, the execution of these steps is not strictly restrictive and may be performed in other order. Moreover, at least some of the steps in FIG. 1, FIG. 2, FIG. 4, FIG. 7 and FIG. 10 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

As shown in FIG. 6, FIG. 9, and FIG. 12, the present disclosure further provides a semiconductor structure, including: a substrate 102, a second trench 118, a protective layer 202, a first dielectric layer 204, a second dielectric layer 122, a word line structure 124, and a contact structure 126. First trenches 104 are formed in the substrate 102, where the substrate 102 includes an active pillar 106 positioned between adjacent two of the first trenches 104. The second trench 118 is formed in the active pillar 106, and a bottom of the second trench 118 is greater than or equal to a bottom of the first trench 104 in height. The protective layer 202 is positioned in the first trench 104. The first dielectric layer 204 is positioned between the protective layer 202 and the active pillar 106, and an upper surface of the first dielectric layer 204 is lower than that of the active pillar 106 to expose a part of a side wall of the first trench 104. The second dielectric layer 122 is positioned on a side wall of the active pillar 106 exposed in the first trench 104 and on a side wall of the active pillar 106 exposed in the second trench 118, a third trench 206 is formed between the second dielectric layer 122 and the protective layer 202, and a fourth trench 208 is formed between the second dielectric layers 122. The word line structure 124 is positioned in the third trench 206 and the fourth trench 208. The contact structure 126 is positioned on the word line structure 124, and the contact structure 126 is arranged at intervals with the protective layer 202 and is in contact with the active pillar 106.

In some embodiments, the substrate 102 may use undoped single crystal silicon, single crystal silicon doped with impurities, silicon-on-insulator (SOI), stacked silicon-on-insulator (SSOI), stacked silicon-germanium-on-insulator (S-SiGeOI), silicon-germanium-on-insulator (SiGeOI), and germanium-on-insulator (GeOI), etc. The substrate may also be made of a semiconductor material, such as one or more of silicon, germanium, a silicon germanium compound, and a silicon carbon compound. As an example, in this embodiment, the constituent material of the substrate 102 is selected from single crystal silicon. It is to be understood that the first dielectric layer 204 is positioned on a side wall of the first trench 104 distant from an opening, the side wall of the first trench 104 close to the opening is exposed and is not covered by the first dielectric layer 204, and the protective layer 202 fills up a space between adjacent two of the first dielectric layers 204 on the side wall of the first trench 104. Exemplarily, the first dielectric layer 204 may extend along the side wall of the first trench 104 to cover the bottom of the first trench 104, or may only cover the side wall of the first trench 104 distant from the opening, and an upper surface of the protective layer 202 is greater than or equal to the upper surface of the active pillar 106 in height. The second dielectric layer 122 is positioned on a side wall of the first trench 104 close to the opening and not covered by the first dielectric layer 204 and on a side wall of the second trench 118, the second dielectric layer 122 in the first trench 104 close to the opening is in contact with the first dielectric layer 204. Moreover, a gap between the second dielectric layer 122 in the first trench 104 and the protective layer 202 in the first trench 104 is the third trench 206, and the second dielectric layers 122 on the side wall of the second trench 118 form the fourth trench 208 in the second trench 118. The word line structure 124 positioned in the third trench 206 and the fourth trench 208 may be used as the gate structure of the transistor, which increases the control capability of the gate structure, reduces the leakage current of the semiconductor structure, improves the leakage characteristic of the semiconductor structure, and reduces the resistance of the word line structure. The contact structure 126 is positioned on the substrate 102 between adjacent two of the first trenches 104 and is in contact with the active pillar 106 between the first trench 104 and the second trench 118. The active pillars 106 on two sides of any one of the second trenches 118 may be connected at the same time by means of the contact structure 126, thereby reducing contact resistance between a subsequent capacitor structure and the transistor.

In the above semiconductor structure, the first trenches are formed in the substrate, the second trench is formed in the active pillar between adjacent two of the first trenches, and the second dielectric layers are formed on the side wall of the first trench close to an opening and on the side wall of the second trench to obtain the third trench positioned between the second dielectric layer and the protective layer in the first trench and the fourth trench positioned between adjacent two of the second dielectric layers in the second trench. A word line structure is formed in the third trench and the fourth trench, the contact structure arranged at intervals with the protective layer and coming in contact with the active pillar is formed on the word line structure, the word line structure in the third trench and the word line structure in the fourth trench may be used as the gate structure of the transistor at the same time. The active pillars on two sides of the second trench may be connected at the same time by means of the contact structure, thereby improving the control capability of the gate structure, reducing the leakage current of the semiconductor structure, improving the leakage characteristic of the semiconductor structure, and also reducing the resistance of the word line structure and the contact resistance between the subsequent capacitor structure and the transistor.

In one embodiment, the substrate 102 includes a silicon substrate, and the bottom of the first trench 104 exposes a part of the silicon substrate. The semiconductor structure further includes: a metal silicide 110 positioned at the bottom of the first trench 104, where the metal silicides 110 at the bottoms of adjacent two of the first trenches 104 contact to obtain the bit line structure 112 in the substrate. Exemplarily, a first metal material in the metal silicide 110 includes one or more of tungsten, aluminum, titanium, and cobalt. It is to be understood that the substrate 102 may also be a substrate formed of other semiconductor materials, and in this case, the first metal material may also react with the substrate 102 to generate a corresponding metal silicide.

In one embodiment, a constituent material of the first dielectric layer 204 includes one or more of a nitride, an oxide and an oxynitride, such as silicon dioxide, silicon nitride, and silicon oxynitride.

In one embodiment, a constituent material of the protective layer 202 includes one or more of a nitride, an oxide and an oxynitride, such as silicon dioxide, silicon nitride, and silicon oxynitride.

In one embodiment, the semiconductor structure further includes: a third dielectric layer 120 positioned on the substrate 102, The third dielectric layer 120 can protect the active pillar 106 between adjacent two of the first trenches 104, thereby preventing the performance of the active pillar 106 between adjacent two of the first trenches 104 from being adversely affected during the formation of the metal silicide 110. Exemplarily, a constituent material of the third dielectric layer 120 includes one or more of a nitride, an oxide and an oxynitride, such as silicon dioxide, silicon nitride, and silicon oxynitride. It is to be understood that the constituent material of the third dielectric layer 120 and the constituent material of the protective layer 202 may be the same or may be different. For example, the constituent material of the third dielectric layer 120 is silicon dioxide.

In one embodiment, the upper surface of the first dielectric layer 204 is flush with the lower surface of the second trench 118.

In one embodiment, the second trench 118 is positioned in the center of the active pillar 106.

In one embodiment, the second dielectric layer 122 extends along the side wall of the first trench 104 and the side wall of the second trench 118 to cover the active pillar 106. Exemplarily, the second dielectric layer 122 extends along the side wall of the first trench 104 and the side wall of the second trench 118 to cover the upper surface of the active pillar 106.

In one embodiment, the second dielectric layer 122 is positioned at the bottom of the second trench 118. That is, the second dielectric layer 122 extends along the side wall of the second trench 118 and covers the bottom of the second trench 118. It is to be understood that when the bottom of the second trench 118 is flush with the upper surface of the bit line structure 112, the bit line structure 112 and the word line structure subsequently formed in the second trench 118 may be isolated by means of the second dielectric layer 122 at the bottom of the second trench 118. When the bottom of the second trench 118 is higher than the upper surface of the bit line structure 112, the second dielectric layer 122 may be formed or may not be formed at the bottom of the second trench 118. Exemplarily, a constituent material of the second dielectric layer 122 includes one or more of a nitride, an oxide and an oxynitride, such as silicon dioxide, silicon nitride, and silicon oxynitride. For example, the constituent material of the second dielectric layer 122 is silicon dioxide. It is to be understood that the constituent material of the second dielectric layer 122 and the constituent material of the first dielectric layer 204 may be the same or may be different.

In one embodiment, the word line structure 124 includes: a word line conductive layer 210 and a word line protection layer 212, where the word line conductive layer 210 is positioned in the third trench 206 and the fourth trench 208, and the upper surface of the word line conductive layer 210 is lower than that of the active pillar 106. Exemplarily, a constituent material of the word line conductive layer 210 includes a metal material, a metal nitride material or a polysilicon material, etc., such as titanium, tungsten, copper, aluminum, titanium nitride, polysilicon, and the like. The word line protection layer 212 is positioned on the upper surface of the word line conductive layer 210. Exemplarily, a constituent material of the word line protection layer 212 includes one or more of a nitride, an oxide and an oxynitride, such as silicon dioxide, silicon nitride, and silicon oxynitride.

In one embodiment, the first dielectric layer 204, the second dielectric layer 122 and the word line protection layer 212 are made of the same material. In other embodiments, the constituent material of at least one of the first dielectric layer 204, the second dielectric layer 122, and the word line protection layer 212 is different from other constituent materials.

In one embodiment, the upper surface of the word line protection layer 212 is lower than that of the active pillar 106. In other embodiments, the upper surface of the word line protection layer 212 is greater than or equal to the upper surface of the active pillar 106 in height.

In one embodiment, the upper surface of the second dielectric layer 122 is flush with that of the word line structure 124, such that the surface of the active pillar may be exposed through this step.

In one embodiment, for example, a constituent material of the contact structure 126 is polysilicon.

In one embodiment, the upper surface of the contact structure 126 is higher than that of the protective layer 202. The semiconductor structure further includes a spacer 128 positioned on the upper surface of the protective layer 202, where the spacer 128 covers the upper surface of the contact structure 126.

In one embodiment, the spacer 128 and the protective layer 202 are made of the same material.

In one embodiment, the semiconductor structure further includes: a source region and a drain region in the active pillar 106 between adjacent two of the second dielectric layers 122, where a part of the active pillar 106 parallel to the word line structure 124 between adjacent two of the second dielectric layers 122 is a drift region, where a first part between the drift region and the bit line structure 112 and a second part between the drift region and the upper surface of the active pillar 106 are the source region and the drain region, respectively. For example, the first part between the drift region and the bit line structure 112 is the drain region, and the second part between the drift region and the upper surface of the active pillar 106 is the source region.

In one embodiment, the semiconductor structure further includes: a capacitor structure formed on the spacer 128. The capacitor structure is electrically connected to the contact structure 126 by means of a conductive structure penetrating through the spacer 128 (not shown in the figure), and then is further electrically connected to a device region on the upper surface of the active pillar 106 between adjacent two of the second dielectric layers 122 by means of the contact structure 126.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, patent protection scope of the embodiments of the present disclosure shall be subject to the appended claims.

What is claimed is:

1. A method for fabricating a semiconductor structure comprising:

providing a substrate, first trenches being formed in the substrate, and the substrate comprising an active pillar positioned between adjacent two of the first trenches;

forming a second trench in the active pillar, a bottom of the second trench being greater than or equal to a bottom of the first trench in height;

forming a first dielectric layer and a protective layer in the first trench, the first dielectric layer being positioned between the protective layer and the active pillar, and an upper surface of the first dielectric layer being lower than an upper surface of the active pillar to expose a part of a side wall of the first trench;

forming second dielectric layers on the exposed side wall of the first trench and a side wall of the second trench, a third trench being formed between each of the second dielectric layers and the protective layer, and a fourth trench being formed between the second dielectric layers;

filling the third trench and the fourth trench to form a word line structure; and forming a contact structure on the word line structure, the contact structure and the protective layer being arranged at intervals, and the contact structure being in contact with the active pillar; and wherein the active pillar is cleaved in two parts by the second trench, the fourth trench is formed in the second trench, the word line is all around the two parts, and the contact structure is in contact with the two parts.

2. The fabrication method according to claim 1, wherein the forming a second trench in the active pillar comprises:

forming a first patterned mask layer on the active pillar, the first patterned mask layer being configured to define a shape and a position of the second trench;

forming a first dielectric material layer on the side wall of the first trench, the first dielectric material layer extending along the side wall of the first trench to cover a side wall of the first patterned mask layer;

forming a protective material layer in the first trench; and removing the first patterned mask layer and at least a part of the active pillar below the first patterned mask layer to form the second trench.

3. The fabrication method according to claim 2, wherein an upper surface of the protective material layer is flush with an upper surface of the first patterned mask layer; and when removing the first patterned mask layer and at least a part of the active pillar below the first patterned mask layer, the fabrication method further comprises:

removing a part of the protective material layer, a remaining part of the protective material layer being the protective layer;

wherein under a same removal condition, a rate of removing the protective material layer is less than a rate of removing the active pillar.

4. The fabrication method according to claim 3, wherein a third dielectric layer is formed on the upper surface of the active pillar, and the first patterned mask layer is positioned on an upper surface of the third dielectric layer; and the removing the first patterned mask layer and at least a part of the active pillar below the first patterned mask layer comprises:

removing the first patterned mask layer;

removing the third dielectric layer below the first patterned mask layer; and removing at least a part of the active pillar below the first patterned mask layer.

5. The fabrication method according to claim 2, wherein the forming a first dielectric layer in the first trench comprises:

removing a part of the first dielectric material layer adjacent to the upper surface of the active pillar, a remaining part of the first dielectric material layer being the first dielectric layer.

6. The fabrication method according to claim 1, wherein the forming second dielectric layers on the exposed side wall of the first trench and a side wall of the second trench comprises:

forming the second dielectric layers on the side wall of the first trench and the side wall of the second trench by means of a thermal oxidation process.

7. The fabrication method according to claim 1, wherein the filling the third trench and the fourth trench to form a word line structure comprises:

forming a word line conductive layer in the third trench and the fourth trench respectively, an upper surface of the word line conductive layer being lower than the upper surface of the active pillar; and forming a word line protection layer on the upper surface of the word line conductive layer.

8. The fabrication method according to claim 7, wherein the first dielectric layer, the second dielectric layer, and the word line protection layer are made of a same material.

9. The fabrication method according to claim 7, wherein the upper surface of the word line protection layer is lower than the upper surface of the active pillar.

10. The fabrication method according to claim 9, wherein the forming a contact structure on the word line structure comprises:

forming the contact structure on the word line structure by means of a selective epitaxial growth process.

11. The fabrication method according to claim 1, wherein an upper surface of the contact structure is higher than an upper surface of the protective layer, the fabrication method further comprising:

forming a spacer on the upper surface of the protective layer, the spacer covering the upper surface of the contact structure.

12. The fabrication method according to claim 1, wherein the forming a second dielectric layer on the side wall of the second trench comprises:

forming the second dielectric layer at a bottom of the second trench.

13. A semiconductor structure, comprising:

a substrate, first trenches being formed in the substrate, the substrate comprising an active pillar positioned between adjacent two of the first trenches;

a second trench formed in the active pillar, a bottom of the second trench being greater than or equal to a bottom of the first trench in height;

a protective layer positioned in the first trench;

a first dielectric layer positioned between the protective layer and the active pillar, an upper surface of the first dielectric layer being lower than an upper surface of the active pillar to expose a part of a side wall of the first trench;

second dielectric layers positioned on the exposed side wall of the first trench and a side wall of the second trench, a third trench being formed between each of the second dielectric layers and the protective layer, and a fourth trench being formed between the second dielectric layers;

a word line structure positioned in the third trench and the fourth trench; and a contact structure positioned on the word line structure, the contact structure and the protective layer being arranged at intervals, and the contact structure being in contact with the active pillar; and wherein the active pillar is cleaved in two parts by the second trench, the fourth trench is formed in the second trench, the word line is all around the two parts, and the contact structure is in contact with the two parts.

14. The semiconductor structure according to claim 13, wherein the second trench is positioned in a center of the active pillar.

15. The semiconductor structure according to claim 13, wherein the word line structure comprises:

a word line conductive layer positioned in the third trench and the fourth trench, an upper surface of the word line conductive layer being lower than the upper surface of the active pillar; and a word line protection layer positioned on the upper surface of the word line conductive layer.

16. The semiconductor structure according to claim 15, wherein the first dielectric layer, the second dielectric layer and the word line protection layer are made of a same material.

17. The semiconductor structure according to claim 15, wherein the upper surface of the word line protection layer is lower than the upper surface of the active pillar.

18. The semiconductor structure according to claim 13, wherein an upper surface of the contact structure is higher than an upper surface of the protective layer, the semiconductor structure further comprising:

a spacer positioned on the upper surface of the protective layer and the upper surface of the contact structure.

19. The semiconductor structure according to claim 13, further comprising:

a bit line structure positioned in the substrate, the bit line structure being in contact with the active pillar;

wherein an upper surface of the bit line structure is lower than or equal to the bottom of the first trench.

20. The semiconductor structure according to 19, wherein the bit line structure comprises a metal silicide.

\* \* \* \* \*